(12) United States Patent
Cheah et al.

(10) Patent No.: US 10,957,649 B2
(45) Date of Patent: Mar. 23, 2021

(54) OVERPASS DICE STACKS AND METHODS OF USING SAME

(71) Applicant: Intel Corporation, Santa Clara, CA (US)

(72) Inventors: Bok Eng Cheah, Bukit Gambir (MY); Min Suet Lim, Simpang Ampat (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 16/329,080

(22) PCT Filed: Sep. 30, 2016

(86) PCT No.: PCT/US2016/054785
§ 371 (c)(1),
(2) Date: Feb. 27, 2019

(87) PCT Pub. No.: WO2018/063327
PCT Pub. Date: Apr. 5, 2018

(65) Prior Publication Data
US 2019/0229057 A1 Jul. 25, 2019

(51) Int. Cl.
*H01L 23/48* (2006.01)
*H01L 23/538* (2006.01)
(Continued)

(52) U.S. Cl.
CPC .......... *H01L 23/5381* (2013.01); *H01L 23/13* (2013.01); *H01L 23/48* (2013.01);
(Continued)

(58) Field of Classification Search
CPC ..... H01L 23/5381; H01L 23/13; H01L 23/48; H01L 23/5304; H01L 23/5385; H01L 23/5384
(Continued)

(56) References Cited

U.S. PATENT DOCUMENTS 9,966,300 B1 * 5/2018 Kelly .................... H01L 23/147
2011/0304999 A1 12/2011 Yu et al.
(Continued)

FOREIGN PATENT DOCUMENTS

KR     20120094712 A     8/2012
KR     20150005113 A     1/2015
(Continued)

OTHER PUBLICATIONS

"International Application Serial No. PCT/US2016/054785, International Search Report dated Jun. 30, 2017", 3 pgs.
(Continued)

*Primary Examiner* — Tan N Tran
(74) *Attorney, Agent, or Firm* — Schwegman Lundberg & Woessner, P.A.

(57) ABSTRACT

A system in package device includes an overpass die on a package substrate and the overpass die includes a recess on the back side in order to straddle a landed die also on the package substrate. The recess is bounded by at least two overpass walls. Communication between the dice is done with a through-silicon via and communication between the overpass die and the package substrate is also done with a through-silicon via.

27 Claims, 7 Drawing Sheets

(51) Int. Cl.
  *H01L 29/06* (2006.01)
  *H01L 23/00* (2006.01)
  *H01L 25/065* (2006.01)
  *H01L 23/13* (2006.01)
  *H01L 23/14* (2006.01)
  *H01L 23/498* (2006.01)

(52) U.S. Cl.
  CPC ...... *H01L 23/5384* (2013.01); *H01L 23/5385* (2013.01); *H01L 24/00* (2013.01); *H01L 25/0652* (2013.01); *H01L 25/0655* (2013.01); *H01L 29/0657* (2013.01); *H01L 23/147* (2013.01); *H01L 23/49816* (2013.01); *H01L 2224/16* (2013.01); *H01L 2224/16227* (2013.01); *H01L 2225/06513* (2013.01); *H01L 2225/06517* (2013.01); *H01L 2225/06541* (2013.01); *H01L 2225/06555* (2013.01)

(58) Field of Classification Search
  USPC ........................................................ 257/737
  See application file for complete search history.

(56) References Cited

U.S. PATENT DOCUMENTS

2011/0316147 A1  12/2011  Shih et al.
2013/0001797 A1*  1/2013  Choi ..................... H01L 25/105
                                                              257/774

FOREIGN PATENT DOCUMENTS

WO  WO-2013095546 A1  6/2013
WO  WO-2018063327 A1  4/2018

OTHER PUBLICATIONS

"International Application Serial No. PCT/US2016/054785, Written Opinion dated Jun. 30, 2017", 4 pgs.
"International Application Serial No. PCT US2016 054785, International Preliminary Report on Patentability dated Apr. 11, 2019", 6 pgs.

* cited by examiner

US 10,957,649 B2

OVERPASS DICE STACKS AND METHODS OF USING SAME

CLAIM OF PRIORITY

This patent application is a U.S. National Stage Application under 35 U.S.C. 371 from International Application No. PCT/US2016/054785, filed Sep. 30, 2016, published as WO2018/063327 on Apr. 5, 2018, the entirety of which is hereby incorporated by reference herein.

FIELD

The present description relates to microelectronic die packaging and, in particular, to low-profile 3D overpass dice in stacked architecture system-in package implementations.

BACKGROUND

System in package devices are under miniaturization pressure to improve connectivity and to make the packaged device amenable to current manufacturing trends and commercial implementations.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
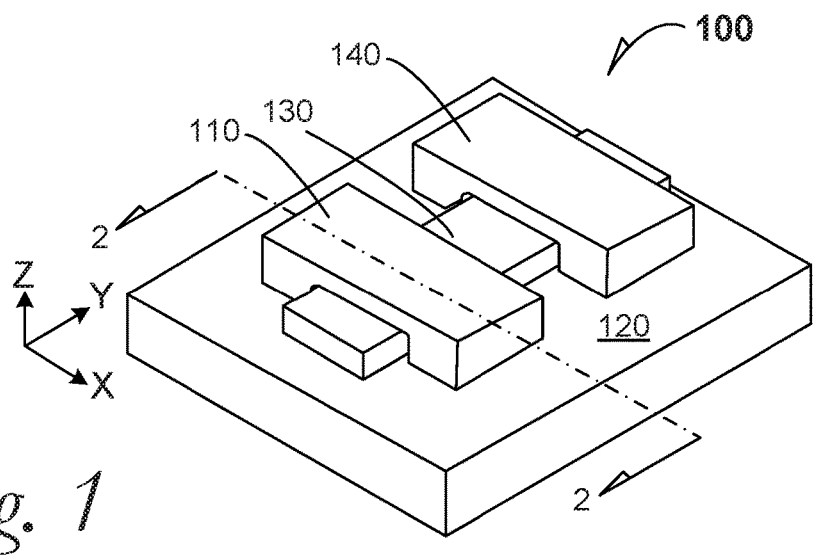
FIG. 1 is a perspective elevation of a system in package device with an overpass first die that is both disposed upon a package substrate and that straddles a landed first die according to an embodiment.

FIG. 1 is a perspective elevation of a system in package (SiP) device 100 with an overpass first die 110 that is both disposed upon a package substrate 120 and that straddles a landed first die 130. The overpass first die 110 has a backside recess 12 that opens the overpass die first die 110 backside 112 to a ledge 117 (see FIG. 2). The overpass first die 110 is mounted on the package substrate 120 with the active surface 111 (see FIG. 2) and the backside surface 112 (see FIG. 2) bumped onto and contacting the package substrate 120.

In an embodiment, the SiP device 100 includes an overpass subsequent die 140 that is both disposed upon the package substrate 120 and that also straddles a landed die; in this embodiment the landed first die 130. The overpass subsequent die 140 also has backside recess.

It can be understood with respect to the landed first die 130, more overpass dice than just the overpass first- and subsequent dice 110 and 140 may be configured upon the package substrate 120, such as an overpass third die (see e.g., FIG. 7) with a backside recess that also would straddle the landed first die 130.

Figure 2:
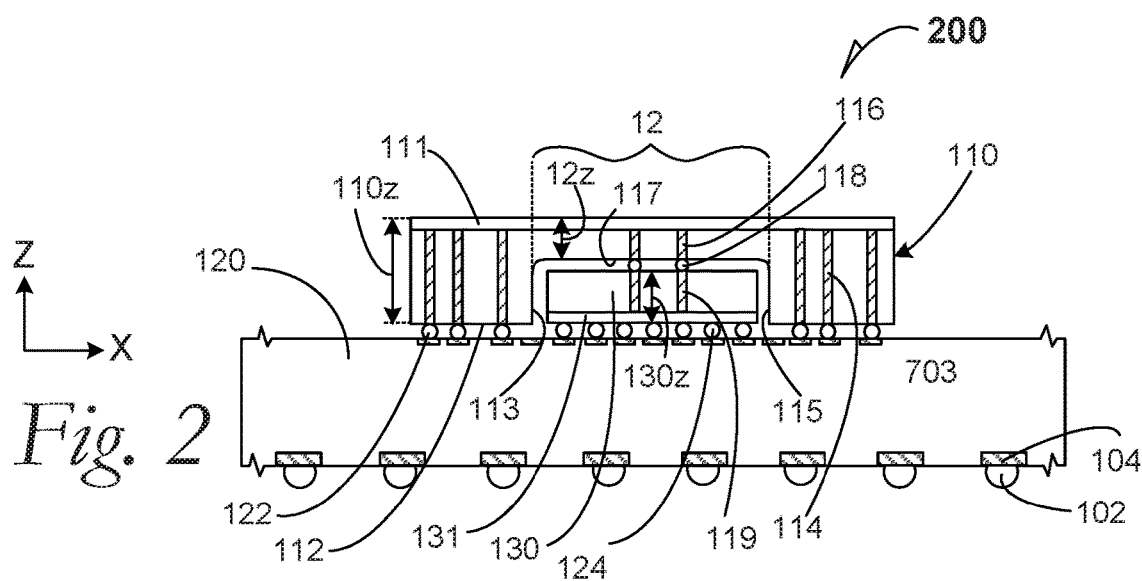
FIG. 2 is a cross-section elevation of the system in package device depicted in FIG. 1 according to an embodiment.

FIG. 2 is a cross-section elevation 200 of the system in package device 100 depicted in FIG. 1 according to an embodiment. The elevation is viewed along the section line 2-2 taken from FIG. 1. FIG. 2 illustrates some embodiments of the landed first die 130 and neighboring structures such as the package substrate 120 and the overpass first die 110.

In an embodiment, the package substrate 120 is land-side bumped with land-side bumps 102 on land-side bond pads 104. In an embodiment, the package substrate 120 is configured without any land-side bumps and the package substrate 120 is usefully insulated such that it serves as an outer shell for a computing device such as any suitable computing device described for FIG. 12.

The overpass first die 110 includes an active surface 111 that in this depiction represents both active devices and metallization. The overpass first die 110 also includes a backside surface 112 that is opposite the active surface 111. In an embodiment, the overpass first die 110 is backside mounted on the package substrate 120 by a series of backside bumps, one of which is indicated with reference numeral 122. In an embodiment, electrical communication between the overpass first die 110 and the package substrate 120 occurs with a transmission contact such as a backside through-silicon via (TSV) one of which is indicated with reference numeral 114 that connects the active surface 111 and a backside bump 122. Several backside TSVs 114 are depicted within the overpass first die 110.

In an embodiment, the landed first die 130 is flip-chip disposed upon the package substrate 120 by a series of bumps, one of which is indicated with reference numeral 124. Although both the backside bumps 122 and the bumps 124 are disposed upon the package substrate 120 at the same surface, it can be understood the bumps may have different structure and function. Consequently a backside bump 122 that contacts the backside TSV 114 may be distinguished by "frontside" bumps 124, which contact the landed die 130 active surface 131; each bump type is in reference to where the bumps are in contact with a semiconductive device.

The landed first die 130 has a z-height 130z that allows it to be flip-chip mounted on the package substrate 120 and within a recess 12 that opens the overpass first die 110 backside surface 112. The overpass first die 110 is bounded by at least recess walls 113 and 115 that open the overpass first die 110 backside surface 112 to the z-depth of a ledge 117. Hereinafter, "recess wall" and "overpass wall" may be used interchangeably. Together where a given recess wall, e.g. recess wall 113 meets the ledge, a contoured transition occurs.

The overpass first die 110 also has a z-height 110z that is different from that of the landed first die 130 z-height 130z. Consequently and in an embodiment, the landed first die 130 z-height 130z is less than the overpass first die 110 z-height 110z. In an embodiment, the landed first die 130 z-height 130z is greater than the overpass first die 110 z-height, such as when the backside bumps 122 are sufficiently tall when coupled with the overpass die 110 z-height 110z, that although the landed first die 130 z-height is greater, the landed first die 130 still fits within the recess 12. For example, the backside die bumps 122 may have a z-height about the same as that of the landed first die 130 z-height 130z. In any event, the landed first die 130 is at least partially inserted into the recess 12.

In an embodiment, communication between the landed first die 130 and the overpass first die 110 is done through a ledge TSV 116 and a ledge bump 118 and from the landed first die 130 through a landed die TSV 119. In an embodiment, the ledge TSV 116 is the same diameter and metallic quality as the backside TSV 114. In an embodiment, the ledge TSV 116 is a different diameter—but the same metallic quality as the backside TSV 114. In an embodiment, the ledge TSV 116 is a different diameter- and a different metallic quality as the backside TSV 114. Similarly, the landed die TSV 119 may differ from either or both of the backside TSV 114 and ledge TSV 116 according to permutations set forth above. For example in an embodiment, the ledge TSV 116 and the landed die TSV 119 are the same diameter- and metallic quality, but they differ from the backside TSV 114 by at least one of diameter and metallic quality.

In an embodiment, TSV communication between the overpass first die 110 and the landed first die 130 is done using less than or equal to the lower half of the metallization layers in each. For example where the landed first die 130 has 14 metallization layers, the TSV 119 only uses between metal-1 (M1) and M7. In an embodiment, TSV 119 uses less than or equal to M1-M3. Similarly for the TSV 116, metallization contact is limited to less than or equal to half of MN where N is the total number of metallization layers. For example where the overpass first die 110 has 14 metallization layers, the TSV 116 only uses between metal-1 (M1) and M7. In an embodiment, TSV 119 uses less than or equal to M1-M3. In an embodiment, the TSV 119 contacts a different number of metallizations than that of the TSV 114, still it adheres to the concept of contacting less than or equal to MN/2. In an embodiment, TSVs 114 nearer the edge of the overpass first die 110 use all metallization layers and TSVs 116 nearer the center adhere to the concept of less than or equal to MN/2.

It can now be understood in an embodiment, the form factor for the system in package device 100 achieves a lower overall z-height than where the landed first die 130 and the overpass first die 110 were to be stack-mounted such as the landed first die 130 were to be mounted at the active surface 111. It can also be understood in an embodiment, the x-y form factor for the system in package device 100 were the two dice 110 and 130 to be mounted side-by-side upon the package substrate 120.

It can now be understood in an embodiment that improved signal integrity performance, such as minimized channel impedance discontinuities and electrical losses, can be achieved through shorter interconnects between the two devices 110 and 130 were they to be mounted side by side.

It can now also be understood in an embodiment that heat management issues can be arranged such as by spacing between the landed first die 130 and the overpass first die 110. For example in an embodiment, the overpass first die 110 may be adjusted in thickness at the narrow dimension 12z such that a gap exists between the ledge 117 and the backside of the landed first die 130 allows for useful fluid flow therebetween to manage heat. The gap can be quantified as height 110z minus height 12z and also minus height 130z. For example in a heat-management embodiment, the overpass first die 110 may be placed along the Y-axis to avoid a hotspot region in the landed first die 130.

It can now be understood in an embodiment that improved design flexibility such as integration of radio-frequency (RF) components may be located in the system in package device 100 for a useful configuration. For example in an embodiment, an Intel XMM™ 7360 modem chipset can be configured within the device 100 such that RF interference issues can be addressed through the overpass die design. For example in an embodiment, a modem chip may be placed along the Y-axis in a location to minimize RFI issues in the landed first die 130. For example in an embodiment, the walls 113 and 115 and the ledge 117 are RF shielded. Further discussion of shielding is set for in description of FIG. 2A.

Figure 2A:
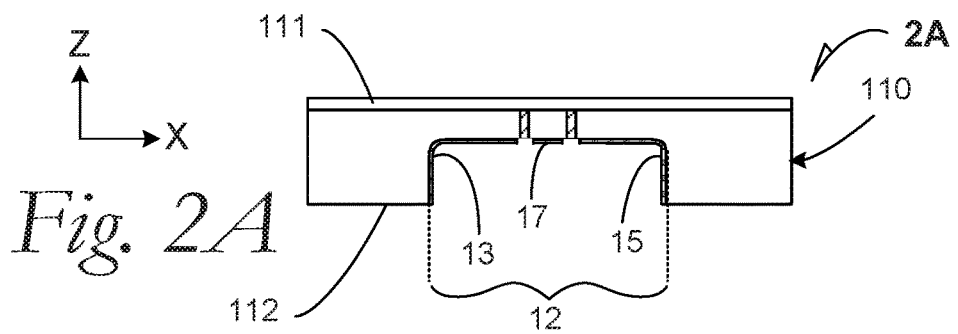
FIG. 2A is a cross-section elevation study of the overpass first die depicted in FIG. 1 according to an embodiment.

FIG. 2A is a cross section elevation study 2A of the overpass first die 110 depicted in FIG. 1 according to an embodiment. The overpass first die has a Faraday-effective shield (hereinafter, an RF shield) 13, 15 and 17 that fills the backside recess 12. When viewed in cross section, the RF shield 13, 15 and 17 indicates breaks that prevent shorting of TSVs 116, but they are circular opens that track the open footprint of the TSV 116 as it communicates to the ledge 117. The RF shield includes recess wall sections 13 and 15 and a recess ledge section 17. Where this device is viewed in a cross-sectional study at the intersection of a ledge TSV 116 such as in FIG. 2 but taken at a cross section that does not intersect TSVs 114, the RF shield 13, 15 and 17 is open to allow a non-short between the ledge TSV and the ledge section 17 of the RF shield.

Reference is again made to FIG. 1.

In an embodiment, the landed first die 130 is a central processing unit (CPU) such as a processor made by Intel Corporation of Santa Clara, Calif., the overpass first die 110 includes platform controller hub (PCH) functionality, and the overpass subsequent die 140 is a memory die. In an embodiment, the overpass subsequent die 140 is connected to the landed first die 130 as well as with the package substrate 120 with TSVs similar to each—and any of the illustrated embodiments for dice 110 and 130 depicted in FIG. 2.

In an embodiment, the landed first die 130 is a CPU, the overpass first die 110 includes PCH functionality and includes mass-storage memory function, and the overpass subsequent die 140 includes RF functionality that requires an optional RF shield (see FIG. 2A). In an embodiment, the overpass subsequent die 140 is connected to the landed first die 130 as well as with the package substrate 120 with TSVs similar to each—and any of the illustrated embodiments for dice 110 and 130 depicted in FIG. 2.

Figure 3:
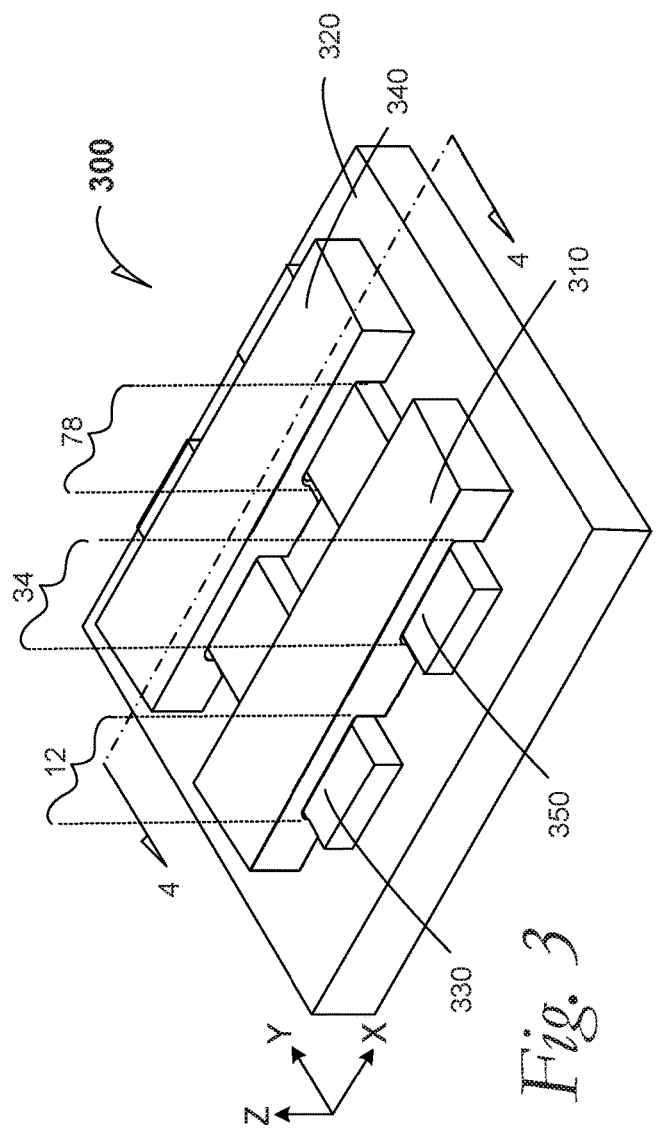
FIG. 3 is perspective elevation of a system in package device that includes at least two overpass dice stacked above a landed die according to an embodiment.

FIG. 3 is a perspective elevation of a system in package (SiP) device 300 with an overpass first die 310 that is both disposed upon a package substrate 320 and that straddles a landed first die 330 according to an embodiment. The overpass first die 310 has a backside first recess 12 and a backside subsequent recess 34 each of which open the overpass first die 310 backside 312 (see Item 112 in FIG. 1 by inference) to a ledge 317 (see Item 347 in FIG. 4 by inference). The overpass first die 310 is mounted on the package substrate 320 with the backside surface bumped onto and contacting the package substrate 320. In an embodiment, the overpass subsequent die 340 is also mounted on the package substrate 320 with the backside surface 342 bumped onto and contacting the package substrate 320 (see FIG. 4).

In an embodiment, the SiP device 300 includes an overpass subsequent die 340 that is both disposed upon the package substrate 320 and that also straddles a landed die; in this embodiment the landed first die 330. The overpass subsequent die 340 also has at least one backside recess. In the illustrated embodiment, a backside first recess 56 is not demarcated in FIG. 3 (see FIG. 4) because it is obscured by demarcation of the backside subsequent recess 34 of the overpass first die 310, but the overpass subsequent die 340 includes a backside subsequent recess 78.

It can be understood with respect to the landed first die 330, more overpass dice than just the overpass first- and subsequent dice 310 and 340 may be configured upon the package substrate 320, such as an overpass third die with at least one backside recess (not pictured) that also would straddle at least one of the landed first die 330 and the landed subsequent die 350.

Figure 4:
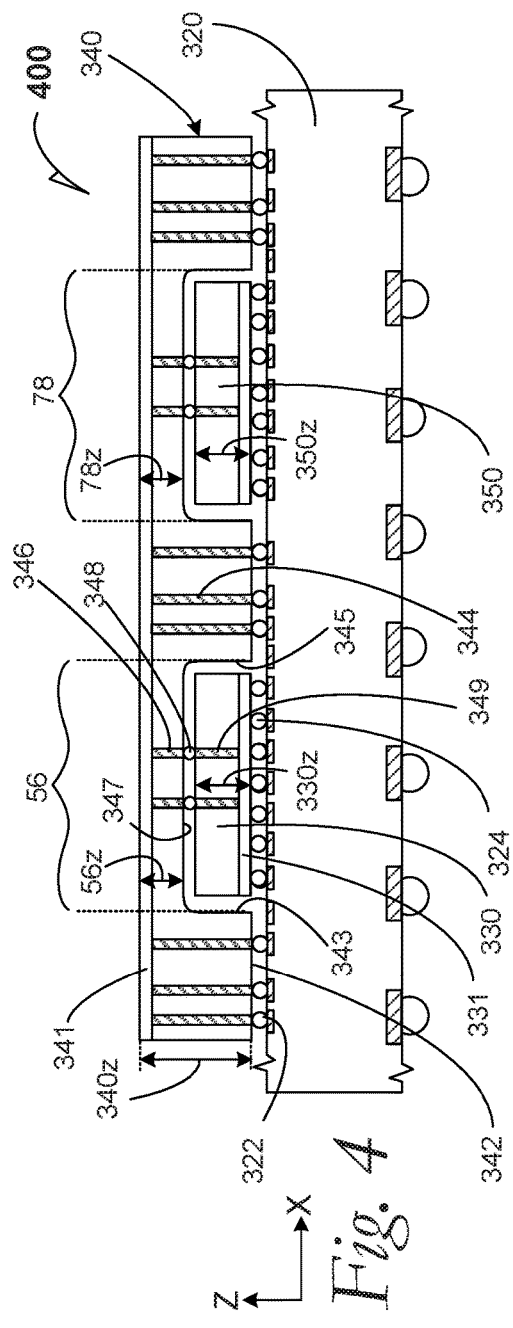
FIG. 4 is a cross-section elevation of the system in package device depicted in FIG. 3 according to an embodiment.

FIG. 4 is a cross-section elevation 400 of the system in package device 300 depicted in FIG. 3 according to an embodiment. The elevation is viewed along the section line 4-4 taken from FIG. 3.

The overpass subsequent die 340 includes an active surface 341 that in this depiction represents both active devices and metallization. The overpass subsequent die 340 also includes a backside surface 342 that is opposite the active surface 341. In an embodiment, the overpass subsequent die 340 is backside mounted on the package substrate 320 by a series of backside bumps, one of which is indicated with reference numeral 322. In an embodiment, electrical communication between the overpass subsequent die 340 and the package substrate 320 occurs with at least one backside through-silicon via (TSV), one of which is indicated with reference numeral 344, which connects the active surface 341 and a backside bump 322. Several backside TSVs 344 are depicted within the overpass subsequent die 340.

In an embodiment, the landed first die 330 is flip-chip disposed upon the package substrate 320 by a series of bumps, one of which is indicated with reference numeral 324. Although both the backside bumps 322 and the bumps 324 are disposed upon the package substrate 320 at the same surface, it can be understood the bumps may have different structure and function. Consequently a backside bump 322 that contacts the backside TSV 344 may be distinguished by "frontside" bumps 324, which contact the landed first die 330 active surface 331, each bump type in reference to where the bumps are in contact with a semiconductive device.

The landed subsequent die 340 has a z-height 340z that allows it to be flip-chip mounted on the package substrate 320 and within a first recess 56 that opens the overpass subsequent die 340 backside surface 342. The overpass subsequent die 340 has recess walls 343 and 345 that open the overpass subsequent die 340 backside surface 342 to a ledge 347. Together where a given recess wall, e.g. recess wall 343 meets the ledge 347, a contoured transition occurs.

The overpass subsequent die 340 also has a z-height 340z that is different from that of the landed first die 330 z-height 330z. Consequently and in an embodiment, the landed first die 330 z-height 330z is less than the overpass subsequent die 340 z-height 340z. In an embodiment, the landed first die 330 z-height 330z is greater than the overpass subsequent die 330 z-height 330z, such as when the backside bumps 322 are sufficiently tall when coupled with the overpass subsequent die 340 z-height 340z, that although the landed first die 330 z-height is greater, the landed first die 330 still fits within the first recess 56. For example, the backside die bumps 322 may have a z-height about the same as that of the landed first die 330 z-height 330z. In any event, the landed first die 330 is at least partially inserted into the first recess 56.

In an embodiment, communication between the landed first die 330 and the overpass subsequent die 340 is done through a ledge TSV 346 and a ledge bump 348 and from the landed first die 330 through a landed die TSV 349. In an embodiment, the ledge TSV 346 is the same diameter and metallic quality as the backside TSV 344. In an embodiment, the ledge TSV 346 is a different diameter—but the same metallic quality as the backside TSV 344. In an embodiment, the ledge TSV 346 is a different diameter- and a different metallic quality as the backside TSV 344. Similarly, the landed die TSV 349 may differ from either or both of the backside TSV 344 and ledge TSV 346 according to permutations set forth above. For example in an embodiment, the ledge TSV 346 and the landed die TSV 349 are the same diameter- and metallic quality, but they differ from the backside TSV 344 by at least one of diameter and metallic quality.

It can now be understood the landed subsequent die 350 may have similar structure and relationship to neighboring structures as does the landed first die 330. For example, the landed subsequent die 350 may have the same structure and relationship between the package substrate 320 and the overpass subsequent die 340. In an embodiment, the dimensions of between at least one of the narrow dimension 56z and narrow dimension 78z, the two dimensions are different. For example where the landed first die 330 and the landed subsequent die 350 are different devices, the respective depths of the recesses 56 and 78 are different to accommodate a useful clearance for each of the dice 330 and 350 beneath the landed subsequent die 340.

In an embodiment, TSV communication between the overpass subsequent die 340 and the landed first die 330 is done using less than or equal to the lower half of the metallization layers in each. For example where the landed first die 330 has 14 metallization layers, the TSV 319 only uses between metal-1 (M1) and M7. In an embodiment, TSV 319 uses less than or equal to M1-M3. Similarly for the TSV 346, metallization contact is limited to less than or equal to half of MN where N is the total number of metallization layers. For example where the overpass subsequent die 340 has 14 metallization layers, the TSV 346 only uses between M1 and M7. In an embodiment, TSV 349 uses less than or equal to M1-M3. In an embodiment, the TSV 349 contacts a different number of metallizations than that of the TSV 344, still it adheres to the concept of contacting less than or equal to MN/2. In an embodiment, TSVs 344 nearer the edge of the overpass subsequent die 340 use all metallization layers and TSVs 346 nearer the center adhere to the concept of less than or equal to MN/2.

It can now be understood in an embodiment, the form factor for the system in package device 300 achieves a lower overall z-height than where the landed first die 330 and the overpass subsequent die 340 were to be stack-mounted such as the landed first die 330 were to be mounted at the active surface 341. It can also be understood in an embodiment, the x-y form factor for the system in package device 300 were the two dice 340 and 330 to be mounted side-by-side upon the package substrate 320.

Several embodiments may now disclosed.

Figure 5:
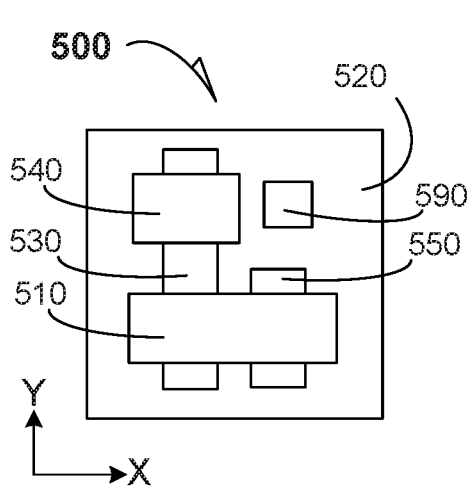
FIG. 5 is a top plan of a system in package device according to an embodiment.

FIG. 5 is a top plan of a system in package device 500 according to an embodiment. An overpass first die 510 is coupled to a landed first die 530, each of which are mounted on a package substrate 520. The overpass first die 510 has two recesses (not pictured) that respectively straddle the landed first die 530 and a landed subsequent die 550. An overpass subsequent die 540 is also mounted on the package substrate 520 with a recess (not pictured) and the overpass subsequent die 540 straddles the landed first die 530. In an embodiment, a component 590 is also mounted on the package substrate 520 but is coupled to at least one of the other devices through connections within the package substrate 520. Hereinafter, a "component" refers to a semiconductive device according to an embodiment. Hereinafter, a "component" refers to a passive device such as a balun, a capacitor, a resistor, an inductor and the like according to an embodiment.

In an embodiment, the landed first die 530 is an ASIC, the landed subsequent die 550 is a mass-storage device such as a non-volatile memory device, the overpass first die 510 has both CPU function and includes platform controller hub (PCH) functionality, the overpass subsequent die 540 is a baseband processor (with an RF shield in the recess), and the component 590 is any useful component embodiment as set forth herein.

Figure 6:
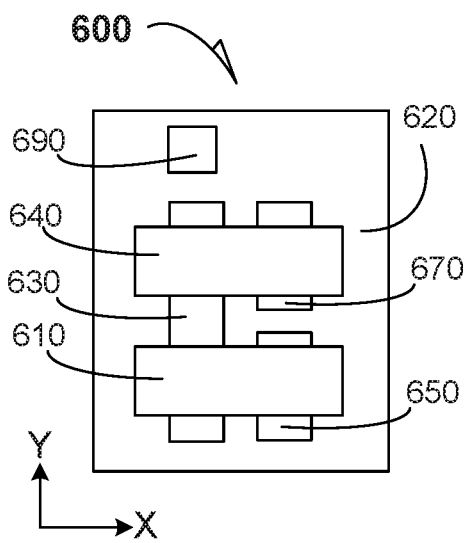
FIG. 6 is a top plan of a system in package device according to an embodiment.

FIG. 6 is a top plan of a system in package device 600 according to an embodiment. An overpass first die 610 is coupled to a landed first die 630, each of which are mounted on a package substrate 620. The overpass first die 610 has two recesses (not pictured) that respectively straddle the landed first die 630 and a landed subsequent die 650. An overpass subsequent die 640 is also mounted on the package substrate 620 with a recess (not pictured) and the overpass subsequent die 640 straddles the landed first die 630 as well as a landed third die 670. In an embodiment, a component 690 is also mounted on the package substrate 620 but is coupled to at least one of the other devices through connections within the package substrate 620.

Figure 7:
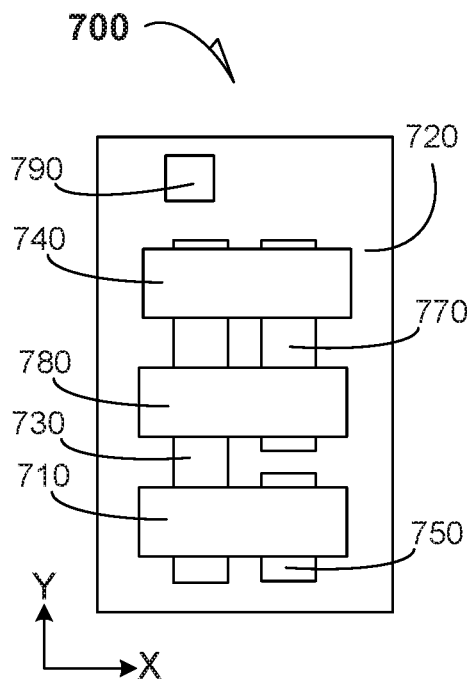
FIG. 7 is a top plan of a system in package device according to an embodiment.

FIG. 7 is a top plan of a system in package device 700 according to an embodiment. An overpass first die 710 is coupled to a landed first die 730, each of which are mounted on a package substrate 720. The overpass first die 710 has two recesses (not pictured) that respectively straddle the landed first die 730 and a landed subsequent die 750. An overpass subsequent die 740 is also mounted on the package substrate 720 with a recess (not pictured) and the overpass subsequent die 740 straddles the landed first die 730 as well as a landed third die 770. An overpass third die 780 is also mounted on the package substrate 720 with two recesses (not pictured) and the overpass third die 780 straddles the landed first die 730 as well as the landed third die 770. In an embodiment, a component 790 is also mounted on the package substrate 720 but is coupled to at least one of the other devices through connections within the package substrate 720.

Figure 8:
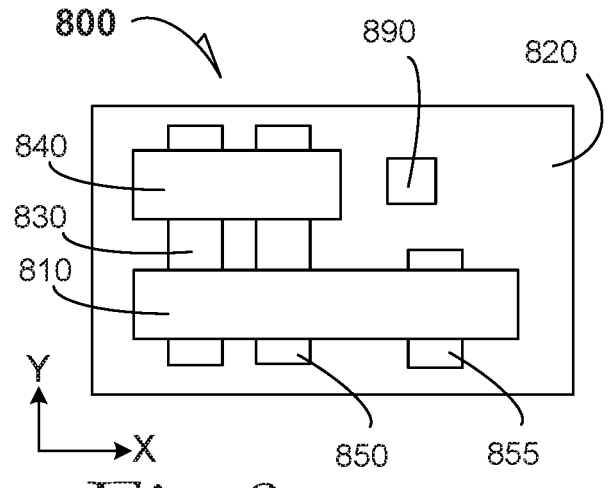
FIG. 8 is a top plan of a system in package device according to an embodiment.

FIG. 8 is a top plan of a system in package device 800 according to an embodiment. An overpass first die 810 is coupled to a landed first die 830, each of which are mounted on a package substrate 820. The overpass first die 810 has three recesses (not pictured) that respectively straddle the landed first die 830, a landed subsequent die 850, and a landed third die 855. An overpass subsequent die 840 is also mounted on the package substrate 820 with two recesses (not pictured) and the overpass subsequent die 840 straddles the landed first die 830 and the landed subsequent die 850. In an embodiment, a component 890 is also mounted on the package substrate 820 but is coupled to at least one of the other devices through connections within the package substrate 820.

It can now be understood for any of the illustrated embodiments depicted in FIG. 5, 6, 7 or 8 that improved signal integrity performance, such as minimized channel impedance discontinuities and electrical losses, can be achieved through shorter interconnects between e.g. two devices 510 and 530 were they to be mounted side by side.

It can now also be understood in an embodiment that heat management issues can be arranged such as by spacing between e.g., the landed first die 630 and the overpass first die 610. For example in an embodiment, the overpass first die 610 may be adjusted in thickness at the narrow dimension, such as the narrow dimension 12z depicted in FIG. 2, such that a gap exists between the landed first die 630 and the overpass first die 610 to allow for useful fluid flow therebetween to manage heat.

It can now be understood in an embodiment that improved design flexibility such as integration of radio-frequency (RF) components may be located in the system in e.g., a package device 700 for a useful configuration. For example in an embodiment, an Intel XMM™ 7360 modem chipset can be configured within the system in package device 700 such that RF interference issues can be addressed through the overpass die design. For example in an embodiment, a modem chip may be placed along the Y-axis in a location to minimize RFI issues in the landed first die 730. For example in an embodiment as illustrated in FIG. 2, analogous shielded walls to the walls 113 and 115 and the ledge 117 are provided.

Reference is again made to FIG. 3 but following discussion may be applied to the system in package devices 500, 600, 700 and 800.

In an embodiment, the landed first die 330 is a central processing unit (CPU) such as a processor made by Intel Corporation of Santa Clara, Calif., the overpass first die 310 includes platform controller hub (PCH) functionality, and the overpass subsequent die 340 is a memory die. In an embodiment, the overpass subsequent die 340 is connected to the landed first die 330 as well as with the package substrate 320 with TSVs similar to each—and any of the illustrated embodiments for dice 310 and 330 depicted and described herein and in FIG. 4.

Figure 9:
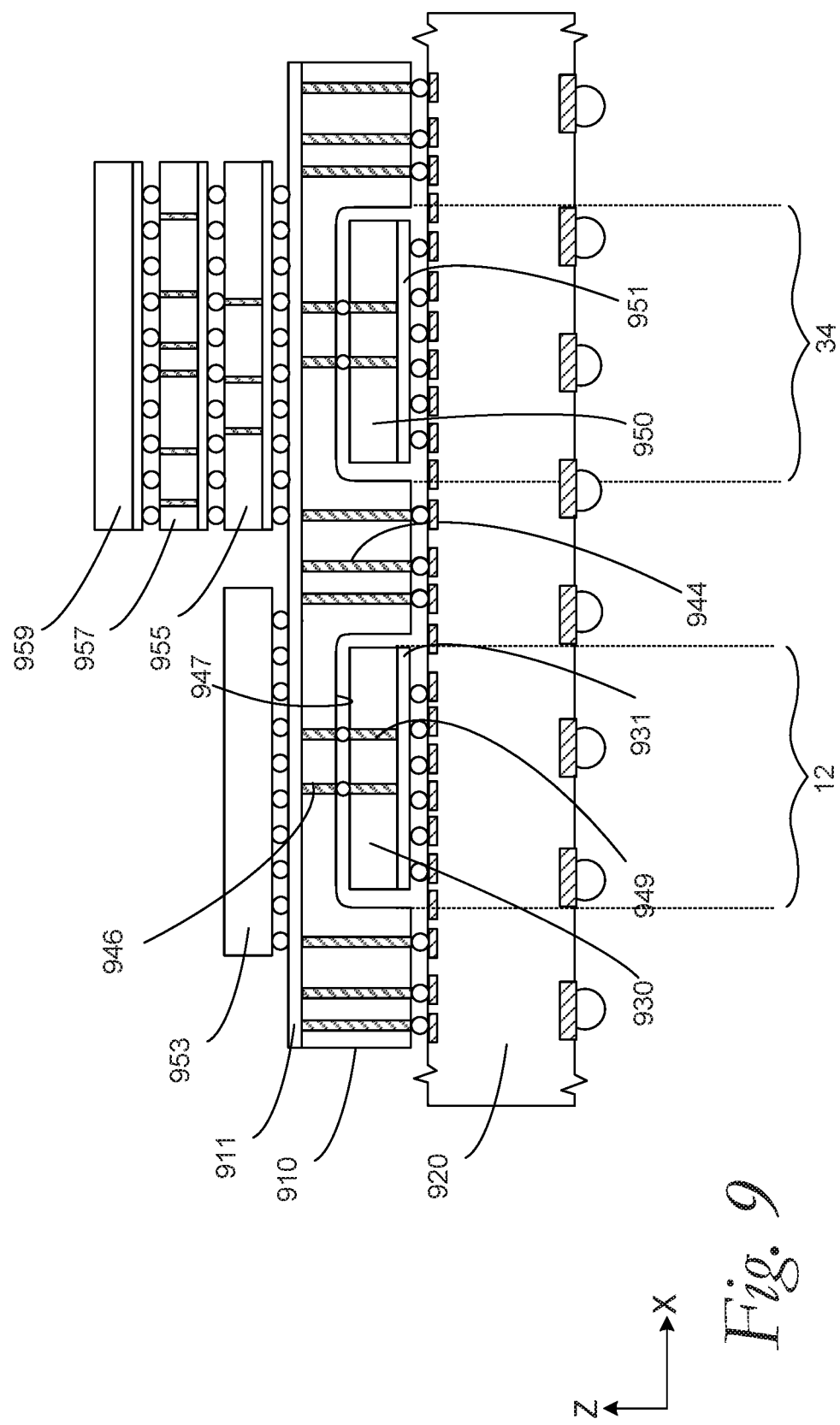
FIG. 9 is a cross section elevation of a system in package device according to an embodiment.

FIG. 9 is a cross section elevation of a system in package device 900 according to an embodiment. Similar to the structure depicted in FIG. 4, the system in package device 900 includes an overpass first die 910, a landed first die 930 and a landed subsequent die 950. In an embodiment, the overpass first die functions principally as a silicon interposer and the structure 911 is a passive routing layer such as metallization without active devices.

In an embodiment, the landed first die 930 includes a TSV 949 that communicates between the active surface 931 thereof and the active surface 911 of the overpass first die 910. Similarly the landed subsequent die may be TSV connected to the active surface 951 thereof. In an embodiment, the overpass first die 910 has a backside TSV 944 that bumps onto the package substrate 920 and that communicates to the active surface 911 of the over pass first die 910. Similar structures may be found with respect to the landed subsequent die 950. In an embodiment, the overpass first die 910 also has a ledge TSV 946 that communicates to the landed first die 930 from the ledge 947 within the recess 12. Similar structures may be found with respect to the landed subsequent die 850.

In an embodiment, a stacked first die 953 is flip-chip mounted onto the active surface 911 of the overpass first die 910 at an x-dimension location that intersects the first recess 12. In an embodiment, the stacked first die 953 is an application-specific integrated circuit (ASIC) that communicates to the overpass first die 910.

In an embodiment, a stacked subsequent die 955 is flip-chip mounted onto the active surface 911 of the overpass first die 910 at an x-dimension location that intersects the subsequent recess 34.

In an embodiment, a second-tier stacked die 957 is stacked upon the stacked subsequent die 955. In an embodiment, a third-tier stacked die 959 is stacked upon the second-tier die 957. In an embodiment, the stacked subsequent die 955, the second-tier stacked die 957 and the third-tier stacked die 959 are part of a stacked dynamic random-access memory (DRAM) component. In an embodiment, the stacked subsequent die 955 and the second-tier stacked die 957 are part of a stacked DRAM component, and the third-tier stacked die 959 is a non-volatile memory device such as a flash memory device. In an embodiment, the stacked subsequent die 955 is a stacked DRAM component, the second-tier stacked die 957 and the third-tier stacked die 959 are non-volatile memory devices such as a flash memory device stack.

FIGS. 10A through 10D represent processing a wafer for configuring at least one overpass die according to an embodiment. A semiconductive wafer 1001, for example, bulk silicon has been processed to achieve active devices and metallization 1011 on one wafer surface and a backside 1012 on the opposite surface.

Figure 10A:
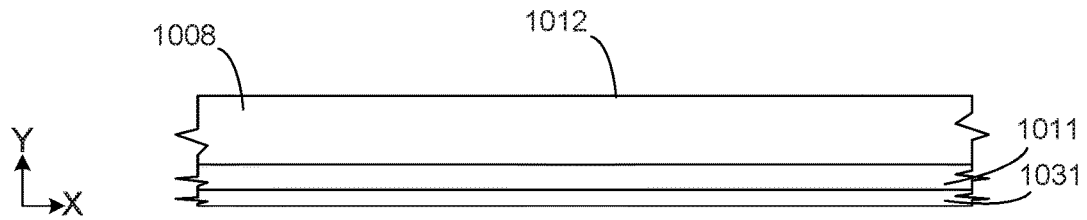
FIGS. 10A through 10D represent processing a wafer for configuring at least one overpass die according to an embodiment.

At FIG. 10A, the semiconductive wafer 1008 is mounted upon a carrier film 1031 such as a Mylar based tape.

Figure 10B:
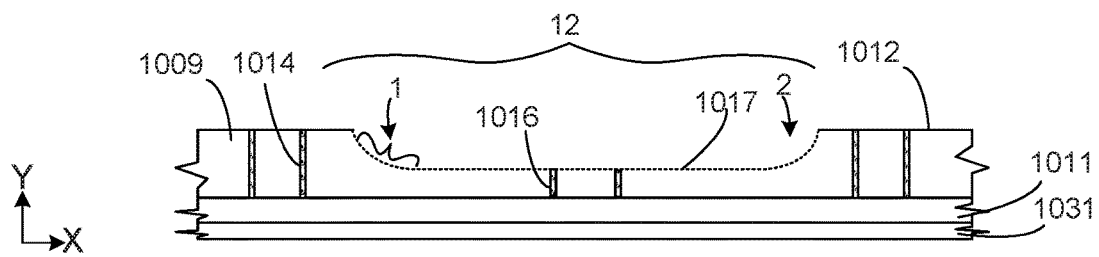

At FIG. 10B, a recess 12 is formed by chemical processing to transform the wafer 1008 in FIG. 10A to the processed wafer 1009. Chemical process may be done such as by modified isotropic wet etching such that a recess 12, which includes contoured notches 1 and 2, is formed that leaves a sidewall, a contoured section, and a ledge 1017. In an embodiment, a directional etch is started such as through a mask, followed either by anisotropic etch modification or isotropic etching to form a contoured section.

Quantification the contour length can be done by observing contour length (estimated by the bracket to which the notch 1 is pointing) from the backside 1012 at the edge of the recess until the ledge 1017. In an embodiment, the degree of contour for the contoured section at the notch 1 is quantified by using microscopy ratios taken from a theoretical unit circle that can be imposed in part along the contoured section and evaluating the diameter, D. For example, a maximum contour length for the contoured section is essentially one-fourth of the arc length of a unit circle and the contoured section has a length of $\pi D/4$ where D is the diameter of the unit circle. In an embodiment, the notch 1 has maximum contour length of $\pi D/4$ at the contoured section. In an embodiment, the notch 1 has contour length in a range from $1.0*\pi D/4 > L > 0.25*\pi D/4$. In other words, the contour length, L is between maximum and 25% of maximum. In an embodiment, the notch 1 has contour length at the contoured section in a range from $0.9*\pi D/4 > L > 0.3*\pi D/4$. In an embodiment, the notch 1 has contour length at the contoured section in a range from $0.8*\pi D/4 > L > 0.4*\pi D/4$. In an embodiment, the notch 1 has contour length at the contoured section 135 in a range from $0.7*\pi D/4 > L > 0.5*\pi D/4$.

In some instances, quantifying length embodiment of the contoured section may require piecemeal measuring where the contour deviates from an ideal unit circle. In an embodiment, the length, L, at the contoured section, can be quantified by microscopy where a unit length such as a 1 nanometer (nm) is mapped onto a portion of the contoured section. For example, the contoured section might be estimated at, e.g. 5.25 nm, which would be five and one-fourth of 1 nm lengths that can be mapped on to the entire contoured section. The particular contour and length of contouring can be formed by processing parameters that may be known in the art.

In an embodiment, TSVs 1014 and 1016 are formed in the processed wafer 1009 including a TSV that will be backside-bumped. In an embodiment, all TSVs are formed in the wafer 1009 depicted in FIG. 10A, followed by recess etching and some polishing to lower the filled via TSV 1016. In an embodiment, a TSV is formed in a selected wafer (1008 or 1009) by physical drilling, followed by TSV forming either by electroless or electrolytic plating. In an embodiment, a TSV is formed in a selected wafer (1008 or 1009) by laser drilling, followed by TSV forming either by electroless or electrolytic plating.

Figure 10C:
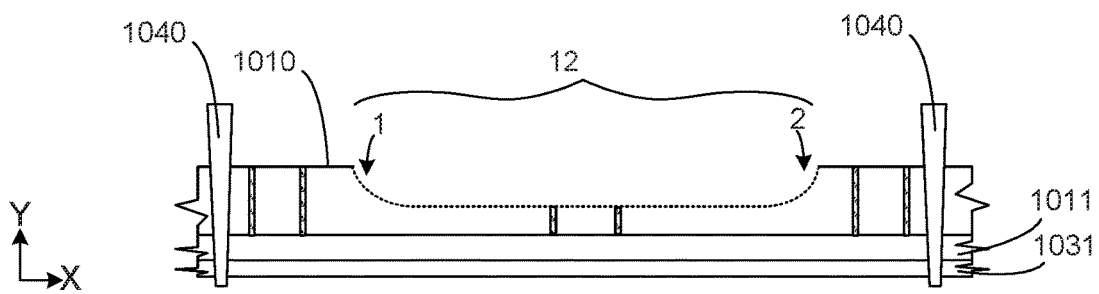

At FIG. 10C, wafer dicing is carried out such as with a dicing saw 1040 to form an overpass die 1010 with a recess 12 that opens a portion of a backside surface 1012 and that is configured to be an overpass die such as any of the overpass die embodiments depicted in this disclosure. These embodiments may be carried out such as by die attach processing and die stacking.

Figure 10D:
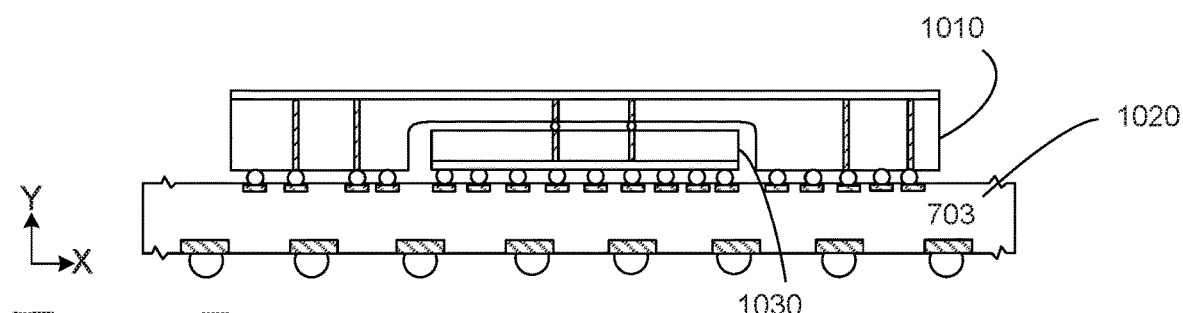

At FIG. 10D, the process includes overpass die 1010 mounting onto a package substrate 1020. In an embodiment, the overpass die 1010 is simultaneously connected to a landed die 1030.

Figure 11:
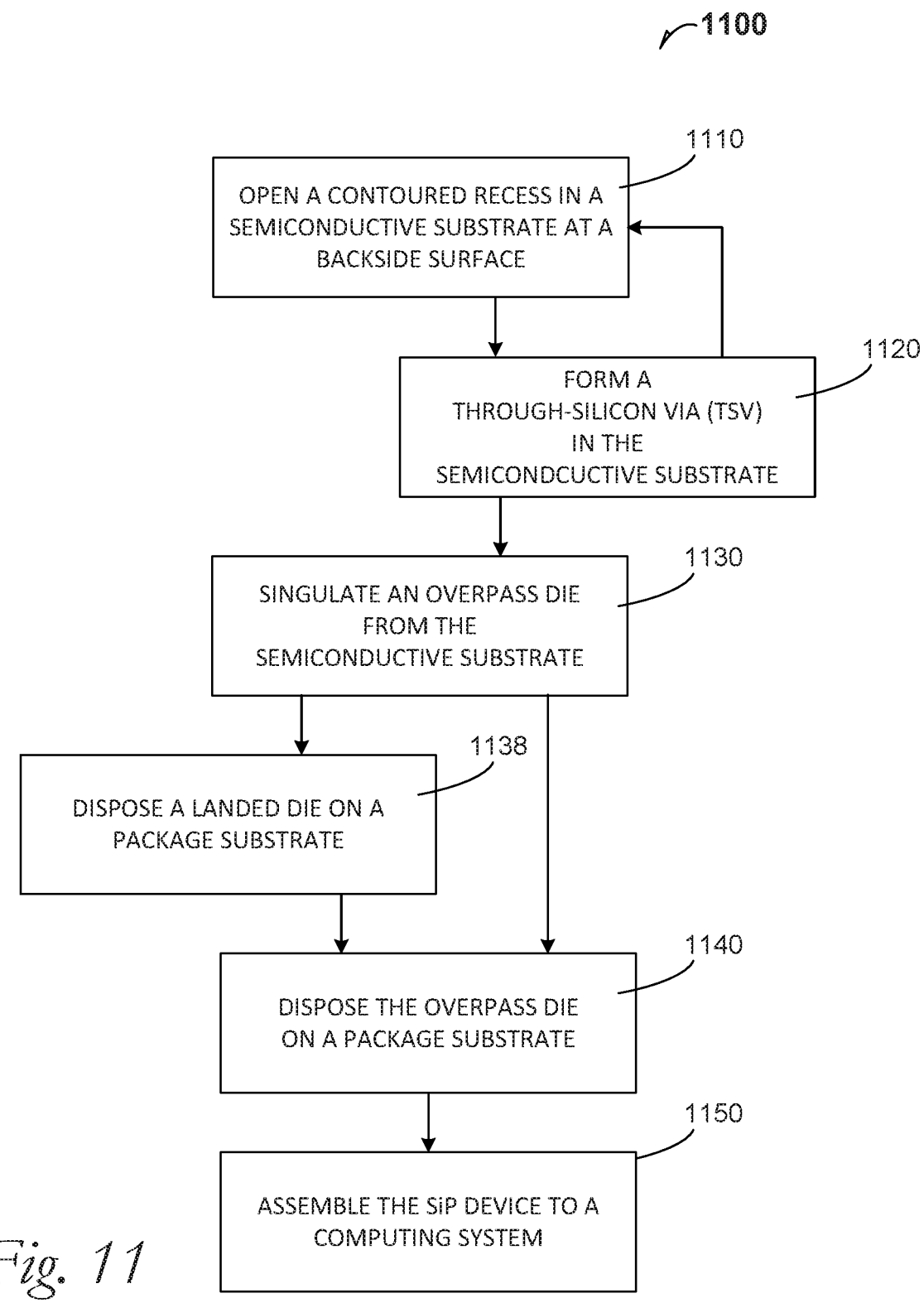
FIG. 11 is a process flow diagram depicting processing methods according to several embodiments.

FIG. 11 is a process flow diagram 1100 depicting processing methods according to several embodiments.

At 1110, the process includes opening a contoured recess in a semiconductive substrate at a backside surface. By way of non-limiting example, the semiconductive wafer 1008 depicted in FIG. 10A is processed to form a contoured recess 12 as depicted in FIG. 10B.

At 1120, the process includes forming a TSV in the semiconductive substrate. By way of non-limiting example, laser drilling followed by electroplating a TSV 1014 or a TSV 1016 is carried out as depicted at FIG. 10B. In an embodiment, processing begins by forming TSVs, followed by forming the contoured recess such that process flow begins at 1120 and proceeds to 1110.

At 1130, the process includes singulating an overpass die from the semiconductive substrate. By way of non-limiting example, a dicing saw 1040 singulates a die 1010 as depicted in FIG. 10C.

At 1140, the process includes disposing the overpass die on a package substrate to become a mounted overpass die. By way on non-limiting example, the overpass die 1010 depicted in FIG. 10D, is disposed upon the package substrate 1020. It can now be understood the overpass die 1010 may not straddle a landed die, but the recess 12 may be left open in which a system in package device is formed with at least one overpass die with at least one recess that does not straddle a landed die. It can now be understood the overpass die 1010 may not straddle a landed die, but the recess 12 may be filled with a heat slug that contacts the overpass die backside and recess. Consequently, an overpass die may have a first recess and a subsequent recess where on recess is heat-slug filled near an overpass die hotspot, and a subsequent recess that straddles a landed die. This can be appreciated in any of FIG. 5, 6, 7 or 8 by way on non-limiting example where a given structure, e.g., item 550 in FIG. 5 is a heat slug. Or by way of non-limiting example where a given structure, e.g., item 770 in FIG. 7 is a heat slug. It is now understandable that where real estate within e.g., the package substrate 520 is not available to sink a device, a landed, under-recess heat slug can be deployed on the package substrate 520 as a passive heat-removal structure.

At 1138, the process includes disposing a landed die on the package substrate to become a landed die that will be straddled by an overpass die.

At 1150, the process includes assembling the system in package device to a computing system.

Figure 12:
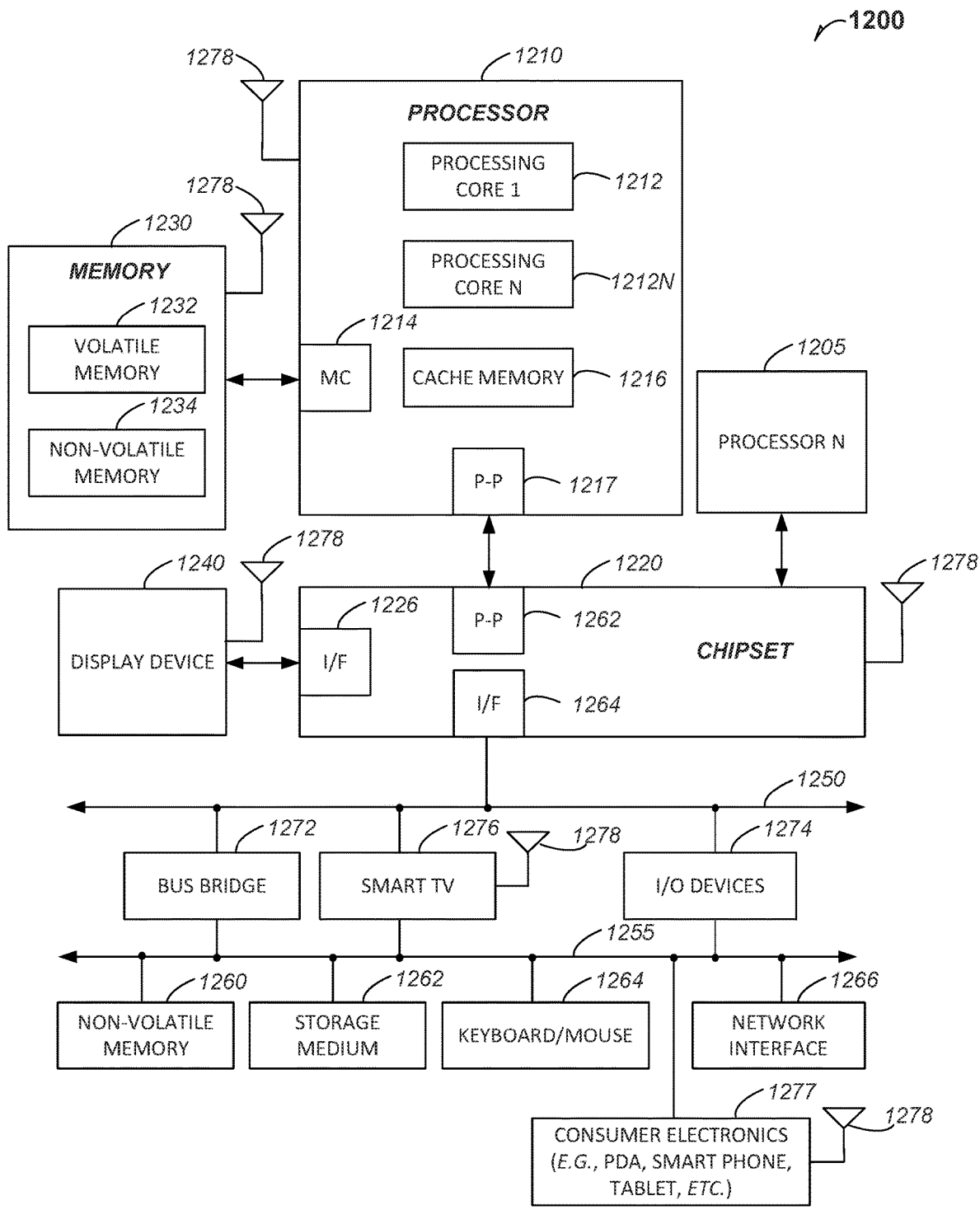
FIG. 12 is a block diagram of a computing device suitable for use with embodiments.

FIG. 12 is a computing system 1200 according to an embodiment. FIG. 12 illustrates a system level diagram, according to one embodiment of the invention. For instance, FIG. 12 depicts an example of an SiP device (e.g., the SiP device 100) including at least one overpass die and optionally at least one landed die as described in the present disclosure.

FIG. 12 is included to show an example of a higher level device application for the present invention. In an embodiment, a system 1200 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the SiP device system 1200 is a system on a chip (SOC) system.

In an embodiment, the package substrate described herein is both the electronic package substrate on the die side and it serves as an outer device shell. For example the package substrate 120 depicted in FIG. 2 is configured without the land-side bumps 102 and pads 104, and it is usefully insulated to allow the otherwise land side to be an outer shell of a computing device.

In an embodiment, the processor 1210 has one or more processing cores 1212 and 1212N, where 1212N represents the Nth processor core inside processor 1210 where N is a positive integer. In an embodiment, the SiP device system 1200 includes multiple processors including 1210 and 1205, where the processor 1205 has logic similar or identical to the logic of the processor 1210. In an embodiment, the processing core 1212 includes, but is not limited to, pre-fetch logic to fetch instructions, decode logic to decode the instructions, execution logic to execute instructions and the like. In an embodiment, the processor 1210 has a cache memory 1216 to cache at least one of instructions and data for the SiP device system 1200. The cache memory 1216 may be organized into a hierarchal structure including one or more levels of cache memory.

In an embodiment, the processor 1210 includes a memory controller 1214, which is operable to perform functions that enable the processor 1210 to access and communicate with memory 1230 that includes at least one of a volatile memory 1232 and a non-volatile memory 1234. In an embodiment, the processor 1210 is coupled with memory 1230 and chipset 1220. The processor 1210 may also be coupled to a wireless antenna 1278 to communicate with any device configured to at least one of transmit and receive wireless signals. In an embodiment, the wireless antenna interface 1278 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 1232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1234 includes, but is not limited to, flash memory, phase change memory (PCM), read-only memory (ROM), electrically erasable programmable read-only memory (EEPROM), or any other type of non-volatile memory device.

The memory 1230 stores information and instructions to be executed by the processor 1210. In an embodiment, the memory 1230 may also store temporary variables or other intermediate information while the processor 1210 is executing instructions. In the illustrated embodiment, the chipset 1220 connects with processor 1210 via Point-to-Point (PtP or P-P) interfaces 1217 and 1222. Either of these PtP embodiments may be achieved using a semiconductive bridge as set forth in this disclosure. The chipset 1220 enables the processor 1210 to connect to other elements in the SiP device system 1200. In an embodiment, interfaces 1217 and 1222 operate in accordance with a PtP communication protocol such as the Intel® QuickPath Interconnect (QPI) or the like. In other embodiments, a different interconnect may be used.

In an embodiment, the chipset 1220 is operable to communicate with the processor 1210, 1205N, the display device 1240, and other devices 1272, 1276, 1274, 1260, 1262, 1264, 1266, 1277, etc. The chipset 1220 may also be coupled to a wireless antenna 1278 to communicate with any device configured to at least do one of transmit and receive wireless signals.

The chipset 1220 connects to the display device 1240 via the interface 1226. The display 1240 may be, for example, a liquid crystal display (LCD), a plasma display, cathode ray tube (CRT) display, or any other form of visual display device. In an embodiment, the processor 1210 and the chipset 1220 are merged into a single SOC. Additionally, the chipset 1220 connects to one or more buses 1250 and 1255 that interconnect various elements 1274, 1260, 1262, 1264, and 1266. Buses 1250 and 1255 may be interconnected together via a bus bridge 1272. In an embodiment, the chipset 1220 couples with a non-volatile memory 1260, a mass storage device(s) 1262, a keyboard/mouse 1264, and a network interface 1266 by way of at least one of the interface 1224 and 1204, the smart TV 1276, and the consumer electronics 1277, etc.

In an embodiment, the mass storage device 1262 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 12 are depicted as separate blocks within the SiP device system 1200, the functions performed by some of these blocks may be integrated within a single semiconductor circuit or may be implemented using two or more separate integrated circuits. For example, although cache memory 1216 is depicted as a separate block within processor 1210, cache memory 1216 (or selected aspects of 1216) can be incorporated into the processor core 1212.

To illustrate the overpass-die electronic assemblies, electronic packages and methods disclosed herein, a non-limiting list of examples is provided herein:

Example 1 is a system in package device comprising: an overpass first die disposed on a package substrate, wherein the overpass first die includes an active surface and a backside surface, wherein the backside surface is connected to the package substrate by a through-silicon via (TSV) and a backside bump, and wherein the overpass first die includes a first recess in the backside surface that is bounded by at least two overpass walls.

In Example 2, the subject matter of Example 1 optionally includes a landed first die disposed on the package substrate, wherein the overpass first die straddles the landed first die at the first recess.

In Example 3, the subject matter of any one or more of Examples 1-2 optionally include a landed first die disposed on the package substrate, wherein the overpass first die straddles the landed first die at the first recess, and wherein the landed first die is flip-chip mounted on the package substrate, and wherein the overpass first die and the landed first die are coupled by a TSV that communicates into the first recess.

In Example 4, the subject matter of any one or more of Examples 1-3 optionally include a subsequent recess in the overpass first die, and wherein the subsequent recess opens the backside surface and is also bounded by at least two overpass walls.

In Example 5, the subject matter of any one or more of Examples 1-4 optionally include a subsequent recess in the overpass first die, and wherein the subsequent recess opens the backside surface and is also bounded by at least two overpass walls, further including a landed first die disposed on the package substrate, wherein the overpass first die straddles the landed first die at the first recess.

In Example 6, the subject matter of any one or more of Examples 1-5 optionally include a subsequent recess in the overpass first die, and wherein the subsequent recess opens the backside surface and is also bounded by at least two overpass walls, further including a landed first die disposed on the package substrate, wherein the overpass first die straddles the landed first die at the first recess, and further including a landed subsequent die disposed on the package substrate, wherein the overpass first die straddles the landed subsequent die at the subsequent recess.

In Example 7, the subject matter of any one or more of Examples 1-6 optionally include an overpass subsequent die disposed on the package substrate, the overpass subsequent die including a first recess.

In Example 8, the subject matter of any one or more of Examples 1-7 optionally include an overpass subsequent die disposed on the package substrate, the overpass subsequent die including a first recess, further including a landed first die disposed on the package substrate, wherein the overpass first die straddles the landed first die at the overpass first die first recess.

In Example 9, the subject matter of any one or more of Examples 1-8 optionally include an overpass subsequent die disposed on the package substrate, the overpass subsequent die including a first recess, further including a landed first die disposed on the package substrate, wherein the overpass first die straddles the landed first die at the overpass first die first recess, and wherein the overpass subsequent die also straddles the landed first die at the overpass subsequent die first recess.

In Example 10, the subject matter of any one or more of Examples 1-9 optionally include an overpass subsequent die disposed on the package substrate, the overpass subsequent die including a first recess; a landed first die disposed on the package substrate, wherein the overpass first die straddles the landed first die at the overpass first die first recess, wherein the overpass subsequent die also straddles the landed first die at the overpass subsequent die first recess; and a landed subsequent die disposed on the package substrate, wherein the landed subsequent die is straddled by the overpass first die at the subsequent recess.

In Example 11, the subject matter of any one or more of Examples 1-10 optionally include an overpass subsequent die disposed on the package substrate, the overpass subsequent die including a first recess; and an overpass third die disposed on the package substrate, the overpass third die including a first recess.

In Example 12, the subject matter of any one or more of Examples 1-11 optionally include an overpass subsequent die disposed on the package substrate, the overpass subsequent die including a first recess; a landed first die disposed on the package substrate, wherein the overpass first die straddles the landed first die at the overpass first die first recess, wherein the overpass subsequent die also straddles the landed first die at the overpass subsequent die first recess; a landed subsequent die disposed on the package substrate, wherein the landed subsequent die is straddled by the overpass first die at the subsequent recess; and a landed third die disposed on the package substrate, and wherein the landed third die is also straddled by one of the respective overpass first- and subsequent dice.

In Example 13, the subject matter of any one or more of Examples 1-12 optionally include wherein the overpass first die includes the first recess, a subsequent recess and a third recess, all recesses of which open the overpass die backside surface.

In Example 14, the subject matter of any one or more of Examples 1-13 optionally include wherein the overpass first die functions principally as a semiconductive bridge.

Example 15 is a system in package device comprising: a landed first die that is flip-chip disposed on a package substrate; an overpass first die disposed on the package substrate, wherein the overpass first die includes an active surface and a backside surface, wherein the backside surface is connected to the package substrate by a through-silicon via (TSV) and a backside bump, wherein the overpass first die includes a first recess in the backside surface that is bounded by at least two overpass walls, and wherein the overpass first die and the landed first die are coupled by a TSV that communicates into the first recess; and a component mounted on the package substrate, wherein the component is coupled to at least one of overpass first- and landed first dice through a connection within the package substrate, and wherein the components is selected from the group consisting of a semiconductive device, and a passive device.

In Example 16, the subject matter of Example 15 optionally includes a subsequent recess in the overpass first die, and wherein the subsequent recess opens the backside surface and is also bounded by at least two overpass walls.

In Example 17, the subject matter of any one or more of Examples 15-16 optionally include a subsequent recess in the overpass first die, and wherein the subsequent recess opens the backside surface and is also bounded by at least two overpass walls, further including a landed first die disposed on the package substrate, wherein the overpass first die straddles the landed first die at the first recess.

In Example 18, the subject matter of any one or more of Examples 15-17 optionally include a subsequent recess in the overpass first die, and wherein the subsequent recess opens the backside surface and is also bounded by at least two overpass walls, further including a landed first die disposed on the package substrate, wherein the overpass first die straddles the landed first die at the first recess, and further including a landed subsequent die disposed on the package substrate, wherein the overpass first die straddles the landed subsequent die at the subsequent recess.

In Example 19, the subject matter of any one or more of Examples 15-18 optionally include an overpass subsequent die disposed on the package substrate, the overpass subsequent die including a first recess.

In Example 20, the subject matter of any one or more of Examples 15-19 optionally include an overpass subsequent die disposed on the package substrate, the overpass subsequent die including a first recess, further including a landed first die disposed on the package substrate, wherein the overpass first die straddles the landed first die at the overpass first die first recess.

In Example 21, the subject matter of any one or more of Examples 15-20 optionally include an overpass subsequent die disposed on the package substrate, the overpass subsequent die including a first recess, further including a landed first die disposed on the package substrate, wherein the overpass first die straddles the landed first die at the overpass first die first recess, and wherein the overpass subsequent die also straddles the landed first die at the overpass subsequent die first recess.

In Example 22, the subject matter of any one or more of Examples 15-21 optionally include an overpass subsequent die disposed on the package substrate, the overpass subsequent die including a first recess; a landed first die disposed on the package substrate, wherein the overpass first die straddles the landed first die at the overpass first die first recess, wherein the overpass subsequent die also straddles the landed first die at the overpass subsequent die first recess; and a landed subsequent die disposed on the package substrate, wherein the landed subsequent die is straddled by the overpass first die at the subsequent recess.

In Example 23, the subject matter of any one or more of Examples 15-22 optionally include an overpass subsequent die disposed on the package substrate, the overpass subsequent die including a first recess; and an overpass third die disposed on the package substrate, the overpass third die including a first recess.

In Example 24, the subject matter of any one or more of Examples 15-23 optionally include an overpass subsequent die disposed on the package substrate, the overpass subsequent die including a first recess; a landed first die disposed on the package substrate, wherein the overpass first die straddles the landed first die at the overpass first die first recess, wherein the overpass subsequent die also straddles the landed first die at the overpass subsequent die first recess; a landed subsequent die disposed on the package substrate, wherein the landed subsequent die is straddled by the overpass first die at the subsequent recess; and a landed third die disposed on the package substrate, and wherein the landed third die is also straddled by one of the respective overpass first- and subsequent dice.

In Example 25, the subject matter of any one or more of Examples 15-24 optionally include wherein the overpass first die includes the first recess, a subsequent recess and a third recess, all recesses of which open the overpass die backside surface.

Example 26 is a method of forming a system in package device, comprising: forming an overpass first die by opening a recess in a die backside surface to create the recess bounded by at least two recess walls, wherein the overpass first die includes an active surface and the backside surface; forming a through-silicon via (TSV) in the overpass first die, wherein the TSV communicates to the die backside surface; and mounting the overpass first die on a package substrate.

In Example 27, the subject matter of Example 26 optionally includes wherein the TSV is a backside TSV, the method further including forming a TSV that communicates to the recess.

In Example 28, the subject matter of any one or more of Examples 26-27 optionally include mounting a landed first die on the package substrate, wherein mounting the overpass first die straddles the landed first die.

In Example 29, the subject matter of any one or more of Examples 26-28 optionally include flip-chip mounting a landed first die on the package substrate, wherein mounting the overpass first die straddles the landed first die; and connecting the landed first die to the overpass first die by a TSV that communicates through the recess.

In Example 30, the subject matter of any one or more of Examples 26-29 optionally include flip-chip mounting a landed first die on the package substrate, wherein mounting the overpass first die straddles the landed first die; and connecting the landed first die to the overpass first die by a TSV that communicates through the recess.

Example 31 is a computing system including a system in package device comprising: an overpass first die disposed on a package substrate, wherein the overpass first die includes an active surface and a backside surface, wherein the backside surface is connected to the package substrate by a through-silicon via (TSV) and a backside bump, and wherein the overpass first die includes a first recess in the backside surface that is bounded by at least two overpass walls; a landed first die disposed on the package substrate, wherein the overpass first die straddles the landed first die at the first recess; a component mounted on the package substrate, wherein the component is coupled to at least one of overpass first- and landed first dice through a connection within the package substrate, and wherein the components is selected from the group consisting of a semiconductive device, and a passive device; and wherein the system in package device is part of a chipset that uses a processor and a memory.

In Example 32, the subject matter of Example 31 optionally includes wherein the overpass first die is disposed on the package substrate on a die side, and wherein the package substrate includes is bumped in a bump array on a land side that is opposite the die side.

In Example 33, the subject matter of any one or more of Examples 31-32 optionally include wherein the overpass first die is disposed on the package substrate on a die side, and wherein the package substrate includes a land side that is opposite the die side, and wherein the land side is part of an external shell for the computing system. The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system in package comprising:
    an overpass first die disposed on a package substrate, wherein the overpass first die includes an active surface and a backside surface, wherein the backside surface is connected to the package substrate by a through-silicon via (TSV) and a backside bump, and wherein the overpass first die includes a first recess in the backside surface that is bounded by at least two overpass walls; and
    a landed first die disposed on the package substrate, wherein the overpass first die straddles the landed first die at the first recess, and wherein the landed first die is flip-chip mounted on the package substrate, and wherein the overpass first die and the landed first die are coupled by a TSV that communicates into the first recess.

2. The system in package device of claim 1, further including a landed first die disposed on the package substrate, wherein the overpass first die straddles the landed first die at the first recess.

3. The system in package device of claim 1, further including a second recess in the overpass first die, and wherein the second recess opens the backside surface and is also bounded by at least two overpass walls.

4. The system in package device of claim 1, further including a second recess in the overpass first die, and wherein the second recess opens the backside surface and is also bounded by at least two overpass walls, further including a landed first die disposed on the package substrate, wherein the overpass first die straddles the landed first die at the first recess.

5. The system in package device of claim 1, further including a second recess in the overpass first die, and wherein the second recess opens the backside surface and is also bounded by at least two overpass walls, further including a landed first die disposed on the package substrate, wherein the overpass first die straddles the landed first die at the first recess, and further including a landed subsequent die disposed on the package substrate, wherein the overpass first die straddles the landed subsequent die at the second recess.

6. The system in package device of claim 1, further including an overpass subsequent die disposed on the package substrate, the overpass subsequent die including a subsequent recess.

7. The system in package device of claim 1, further including an overpass subsequent die disposed on the package substrate, the overpass subsequent die including a subsequent recess, further including a landed first die disposed on the package substrate, wherein the overpass first die straddles the landed first die at the first recess.

8. The system in package device of claim 1, further including an overpass subsequent die disposed on the package substrate, the overpass subsequent die including a subsequent recess, further including a landed first die disposed on the package substrate, wherein the overpass first die straddles the landed first die at the first recess, and wherein the overpass subsequent die also straddles the landed first die at the subsequent recess.

9. The system in package device of claim 1, further including:
    an overpass subsequent die disposed on the package substrate, the overpass subsequent die including a subsequent recess;
    a landed first die disposed on the package substrate, wherein the overpass first die straddles the landed first die at the first recess, wherein the overpass subsequent die also straddles the landed first die at the subsequent recess; and
    a landed subsequent die disposed on the package substrate, wherein the landed subsequent die is straddled by the overpass first die at a second recess.

10. The system in package device of claim 1, further including:
an overpass subsequent die disposed on the package substrate, the overpass subsequent die including a subsequent recess; and
an overpass third die disposed on the package substrate, the overpass third die including a third die recess.

11. The system in package device of claim 1, further including:
an overpass subsequent die disposed on the package substrate, the overpass subsequent die including a subsequent recess;
a landed first die disposed on the package substrate, wherein the overpass first die straddles the landed first die at the first recess, wherein the overpass subsequent die also straddles the landed first die at the subsequent recess;
a landed subsequent die disposed on the package substrate, wherein the landed subsequent die is straddled by the overpass first die at a second recess; and
a landed third die disposed on the package substrate, and wherein the landed third die is also straddled by one of the respective overpass first die and overpass subsequent die.

12. The system in package device of claim 1, wherein the overpass first die includes the first recess, a second recess and a third recess, all recesses of which open the overpass die backside surface.

13. The system in package device of claim 1, wherein the overpass first die functions principally as a semiconductive bridge.

14. A system in package device comprising:
a landed first die that is flip-chip disposed on a package substrate;
an overpass first die disposed on the package substrate, wherein the overpass first die includes an active surface and a backside surface, wherein the backside surface is connected to the package substrate by a through-silicon via (TSV) and a backside bump, wherein the overpass first die includes a first recess in the backside surface that is bounded by at least two overpass walls, and wherein the overpass first die and the landed first die are coupled by a TSV that communicates into the first recess; and
a component mounted on the package substrate, wherein the component is coupled to at least one of the overpass first die and the landed first die through a connection within the package substrate, and wherein the component, is selected from one of the group consisting of a semiconductive device, and a passive device.

15. The system in package device of claim 14, further including a second recess in the overpass first die, and wherein the second recess opens the backside surface and is also bounded by at least two overpass walls.

16. The system in package device of claim 14, further including a second recess in the overpass first die, and wherein the second recess opens the backside surface and is also bounded by at least two overpass walls, wherein the overpass first die straddles the landed first die at the first recess.

17. The system in package device of claim 14 further including a second recess in the overpass first die, and wherein the second recess opens the backside surface and is also bounded by at least two overpass walls, wherein the overpass first die straddles the landed first die at the first recess, and further including a landed subsequent die disposed on the package substrate, wherein the overpass first die straddles the landed subsequent die at the second recess.

18. The system in package device of claim 14, further including an overpass subsequent die disposed on the package substrate, the overpass subsequent die including a subsequent recess.

19. The system in package device of claim 14, further including an overpass subsequent die disposed on the package substrate, the overpass subsequent die including a subsequent recess, wherein the overpass first die straddles the landed first die at the first recess.

20. The system in package device of claim 14, further including overpass subsequent die disposed on the package substrate, the overpass subsequent die including a subsequent recess, wherein the overpass first die straddles the landed first die at the first recess, and wherein the overpass subsequent die also straddles the landed first die at the subsequent recess.

21. The system in package device of claim 14, further including:
an overpass subsequent die disposed on the package substrate, the overpass subsequent die including a subsequent recess;
a landed first die disposed on the package substrate, wherein the overpass first die straddles the landed first die at the first recess, wherein the overpass subsequent die also straddles the landed first die at the subsequent recess; and
a landed subsequent die disposed on the package substrate, wherein the landed subsequent die is straddled by the overpass first die at a second recess.

22. The system in package device of claim 14, further including:
an overpass subsequent die disposed on the package substrate, the overpass subsequent die including a subsequent recess; and
an overpass third die disposed on the package substrate, the overpass third die including a third die recess.

23. The system in package device of claim 14, further including:
an overpass subsequent die disposed on the package substrate, the overpass subsequent die including a subsequent recess;
a landed first die disposed on the package substrate, wherein the overpass first die straddles the landed first die at the first recess, wherein the overpass subsequent die also straddles the landed first die at the subsequent recess;
a landed subsequent die disposed on the package substrate, wherein the landed subsequent die is straddled by the overpass first die at a second recess; and
a landed third die disposed on the package substrate, and wherein the landed third die is also straddled by one of the respective overpass first die and overpass subsequent die.

24. The system in package device of claim 14, wherein the overpass first die includes the first recess, a second recess and a third recess, all recesses of which open the overpass die backside surface.

25. A computing system including a system in package device comprising:
an overpass first die disposed on a package substrate, wherein the overpass first die includes an active surface and a backside surface, wherein the backside surface is connected to the package substrate by a through-silicon via (TSV) and a backside bump, and wherein the overpass first die includes a first recess in the backside surface that is bounded by at least two overpass walls;

a landed first die disposed on the package substrate, wherein the overpass first die straddles the landed first die at the first recess;

wherein the overpass first die and the landed first die are coupled by a TSV that communicates into the first recess;

a component mounted on the package substrate, wherein the component is coupled to at least one of overpass first- and landed first dice through a connection within the package substrate, and wherein the components is selected from the group consisting of a semiconductive device, and a passive device; and wherein the system in package device is part of a chipset that uses a processor and a memory.

26. The computing system of claim 25, wherein the overpass first die is disposed on the package substrate on a die side, and wherein the package substrate includes is bumped in a bump array on a land side that is opposite the die side.

27. The computing system of claim 25, wherein the overpass first die is disposed on the package substrate on a die side, and wherein the package substrate includes a land side that is opposite the die side, and wherein the land side is part of an external shell for the computing system.

* * * * *